US009159550B2

(12) United States Patent
Zenasni

(10) Patent No.: US 9,159,550 B2
(45) Date of Patent: Oct. 13, 2015

(54) METHOD FOR PRODUCING A GRAPHENE SHEET ON A PLATINUM SILICIDE, STRUCTURES OBTAINED USING SAID METHOD AND USES THEREOF

(71) Applicant: Commissariat a l'energie atomique et aux energies alternatives, Paris (FR)

(72) Inventor: Aziz Zenasni, Gieres (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 0 days.

(21) Appl. No.: 13/670,373

(22) Filed: Nov. 6, 2012

(65) Prior Publication Data

US 2013/0127023 A1    May 23, 2013

(30) Foreign Application Priority Data

Nov. 7, 2011    (FR) ...................................... 11 60126

(51) Int. Cl.
*H01L 23/58*        (2006.01)
*H01L 21/8238*      (2006.01)
(Continued)

(52) U.S. Cl.
CPC ........... *H01L 21/02274* (2013.01); *B82Y 30/00* (2013.01); *B82Y 40/00* (2013.01);
(Continued)

(58) Field of Classification Search
CPC .............. H01L 21/02606; H01L 51/0048; H01L 29/0669; H01L 29/413; H01L 51/0045; H01L 51/057; H01L 2221/1094; H01L 2224/05193; H01L 2224/05293; H01L 2224/05493; H01L 2224/05693
USPC ............ 438/199, 17, 582; 257/635, 741, 476, 257/209, 529
See application file for complete search history.

(56) References Cited

U.S. PATENT DOCUMENTS

2007/0014151 A1*   1/2007   Zhang et al. ............. 365/185.01
2009/0068471 A1*   3/2009   Choi et al. ..................... 428/408
(Continued)

FOREIGN PATENT DOCUMENTS

EP    2055673 A1    5/2009
EP    2281779 A2    2/2011
FR    2946663 A1    12/2010

OTHER PUBLICATIONS

Reina, et al., "Growth of Large-Area Single- and Bi-Layer Graphere by Controlled Carbon Precipitation on Polycrystalline Ni Surfaces," Nano Research, Tsinghua University Press and Springer-Verlag, 2009, vol. 2, pp. 509-516.
(Continued)

*Primary Examiner* — Robert Bachner
*Assistant Examiner* — Moin Rahman
(74) *Attorney, Agent, or Firm* — Knobbe, Martens, Olson & Bear, LLP

(57) ABSTRACT

The invention relates to a method for producing a graphene sheet on a platinum silicide, wherein the platinum silicide is in the form of a layer or a plurality of pins.
This method comprises:
a) producing a stack by (i) depositing a layer C1 of a diffusion barrier material on a substrate; (ii) depositing, on the layer C1, a layer C2 of a carbon-containing material, wherein said carbon-containing material optionally comprises silicon; (iii) depositing, on the layer C2, a layer C3 of platinum; (iv) depositing a layer C4 of a material of formula $Si_aC_bH_c$ on the layer C3 if the carbon-containing material of the layer C2 is free from silicon; and
b) heat-treating the stack obtained at step a).
It also relates to structures obtained using this method and the uses of these structures.
Applications: manufacture of micro- and nanoelectronic devices, micro- and nanoelectromechanical devices, etc.

11 Claims, 2 Drawing Sheets

(51) Int. Cl.

| | |
|---|---|
| *H01L 21/02* | (2006.01) |
| *C23C 16/56* | (2006.01) |
| *B82Y 40/00* | (2011.01) |
| *H01L 29/06* | (2006.01) |
| *C01B 31/04* | (2006.01) |
| *C23C 10/52* | (2006.01) |
| *C23C 16/02* | (2006.01) |
| *C23C 16/24* | (2006.01) |
| *C23C 28/04* | (2006.01) |
| *C23C 28/00* | (2006.01) |
| *B82Y 30/00* | (2011.01) |

(52) U.S. Cl.
CPC ............ *C01B 31/0446* (2013.01); *C23C 10/52* (2013.01); *C23C 16/0272* (2013.01); *C23C 16/0281* (2013.01); *C23C 16/24* (2013.01); *C23C 16/56* (2013.01); *C23C 28/046* (2013.01); *C23C 28/322* (2013.01); *C23C 28/343* (2013.01); *C23C 28/345* (2013.01); *H01L 29/06* (2013.01)

(56) References Cited

U.S. PATENT DOCUMENTS

| | | | |
|---|---|---|---|
| 2009/0224243 A1* | 9/2009 | Kobayashi et al. | 257/49 |
| 2011/0033677 A1* | 2/2011 | Shin et al. | 428/201 |
| 2012/0211748 A1* | 8/2012 | Miccoli et al. | 257/52 |

OTHER PUBLICATIONS

Li, et al., "Large-Area Synthesis of High-Quality and Uniform Graphene Films on Copper Foils," Science (www.sciencemag.org), Jun. 5, 2009, vol. 324, pp. 1312-1314.

Juang, et al., "Synthesis of graphene on silicon carbide substrates at low temperature," Elsevier, 2009, Carbon 47, pp. 2026-2031.

Reina, et al., "Large Area, Few-Layer Graphene Films on Arbitrary Substrates by Chemical Vapor Deposition," Nano Letters, Massachusetts Institute of Technology, 2009, vol. 9, No. 1, pp. 30-35.

Sutter, et al., "Graphene on Pt (111): Growth and substrate interaction," The American Physical Society, Physical Review B, 80, 245411, (2009).

Hofrichter, et al., "Synthesis of Graphene on Silicon Dioxide by a Solid Carbon Source", NANO Letters, 2010, vol. 10, pp. 36-42.

Search Report dated Mar. 9, 2012 for French application No. 11 60126.

* cited by examiner

METHOD FOR PRODUCING A GRAPHENE SHEET ON A PLATINUM SILICIDE, STRUCTURES OBTAINED USING SAID METHOD AND USES THEREOF

CROSS-REFERENCE TO RELATED APPLICATIONS

This application claims the benefit of French Application No. 11 60126 filed Nov. 7, 2011, which is hereby expressly incorporated by reference in its entirety.

FIELD OF THE INVENTION

The invention relates to the field of manufacturing graphene sheets.

More specifically, the invention relates to a method for producing a mono- or multilayer graphene sheet on a platinum silicide, having the formula $Pt_xSi$, wherein the platinum silicide is in the form of a layer or a plurality of spaced pin.

It also relates to the structures obtained using this method and the use of these structures.

These structures are suitable for use as is in any technical field wherein the manufacture of electronic and electric contacts is sought, particularly in the fields of micro- and nano-electronics and micro- and nanoelectromechanics, for example for manufacturing microelectromechanical or nanoelectromechanical systems, commonly referred to as MEMS and NEMS.

BACKGROUND

Graphene is a two-dimensional carbon crystal, with a hexagonal honeycombed structure.

This crystal has very surprising properties, making the material very popular with many public and private laboratories at the present time.

Indeed, firstly, graphene displays exceptional electron mobility at ambient temperature, of up to 20 $m^2/(V·s)$. By way of comparison, the electron mobility of indium antimonide InSb is, at ambient temperature, two and a half times lower, that of silicon is thirteen times lower, whereas that of silver is two thousand five hundred times lower.

Furthermore, graphene is transparent since the thickness thereof, which is that of a carbon atom, is in the region of 1 Angstrom (0.1 nm). Moreover, it offers a combination of light weight, high chemical stability and high mechanical strength (typically two hundred times greater than that of steel).

The prior art includes a number of techniques for producing graphene sheets such as micromechanical graphite crystal exfoliation, electrochemical reduction of graphene oxide, opening carbon nanotubes, catalytic growth of graphene on a metal substrate or silicon carbide sublimation.

Of these techniques, catalytic growth of graphene on a metal layer appears to be one of the most promising processes for producing graphene on an industrial scale and enabling the integration thereof in micro- or nanoelectro-mechanical or other devices, meeting industrial specifications.

Indeed, using this technique, it has been possible to produce graphene samples of high crystalline quality, characterized by monocrystalline ranges over several hundreds on microns and by a unique crystallographic orientation on a macroscopic scale. Graphene samples with centimetric surface areas have even been obtained, which is not the case of the other techniques for manufacturing graphene available to date.

In the initial version thereof, the catalytic growth of graphene on a metal layer is based on the exposure of a layer of a metal, for example nickel, copper or iridium, heated to a high temperature, i.e. approximately 1000° C., to gas-phase carbon species. Depending on the solubility of carbon in the metal forming the metal layer and the capacity thereof to diffuse in the metal, the formation of a graphene sheet with one or a plurality of graphene layers is obtained on the metal layer.

In this way, monolayer and bilayer graphene sheets on a nickel layer (Reina et al., *Nano Res* 2009, 2, 509-516, [1]), and monolayer graphene sheets on a copper layer (Li et al., *Science* 2009, 47, 2026-2031, [2]) and on a platinum monocrystal (Sutter et al., *Phys. Rev. B* 2009, 80, 245411, [3]) have been obtained.

The metal layer may then be removed by etching and the graphene separated from the layer transferred to another layer.

More recently, Hofrichter et al. (*Nano Lett.* 2010, 10(1), 36-42, [4]) demonstrates that it is possible to product "polygraphene", i.e. a graphene sheet comprising areas with a single graphene layer and areas with a few graphene layers, on a nickel layer no longer using gas-phase carbon species but a solid carbon source, in this instance, a layer of amorphous silicon carbide.

Moreover, the benefit of thin layers of platinum silicides is known.

The semiconductor properties of these silicides are routinely used in the fields of radio-astronomy and electronics, particular for creating contact zones between silicon and one or a plurality of stacked metal layers, enhancing ohmic contacts in MOS (Metal Oxide Semiconductors) and CMOS (Complementary Metal Oxide Semiconductors) technologies, and producing Schottky diodes. The importance of platinum silicides in designing infrared detectors and heat cameras for medical imaging or implementing nano-lithographic methods should be noted.

As such, it is clear that it would be advantageous to have structures comprising a graphene sheet on a thin layer of platinum silicide, in order to combine the qualities of graphene with those of this type of silicide.

It would appear that, to the inventor's knowledge, no prior art document describes the synthesis of a graphene sheet on a platinum silicide. However, a process for producing a monolayer graphene sheet on a nickel silicide was recently described in the literature (Juang et al., *Carbon* 2009, 47, 2026-2031, [5]).

In this reference, the layer of silicon carbide is deposited on a silicon substrate, and coated with the nickel layer and the structure formed undergoes a heat treatment enabling the carbon to dissolve in the nickel, thus forming a layer of nickel silicide, situated at the interface of the layers of silicon carbide and nickel. The formation of the silicon carbide layer competes with a carbon migration phenomenon toward the surface of the nickel layer, the whole helping produce, by catalytic growth, a graphene sheet on the surface.

In principle, this method does not appear to be applicable to the synthesis of a graphene sheet on a platinum silicide, since it is based on the solubility and diffusion properties of carbon in the metal and, in this case, carbon is very slightly soluble in platinum.

The inventor thus set out to achieve the general aim of providing a method for producing a graphene sheet on a platinum silicide.

The inventor also set out to achieve the aim of the method making it possible to obtain a multilayer graphene sheet or monolayer graphene sheet.

Moreover, the inventor also set out to achieve the aim of enabling the synthesis on a platinum silicide in the form of spaced blocks or on a platinum silicide in the form of a layer and, in the latter case, giving rise to a graphene sheet wherein the surface, i.e. the area, is merely limited by the dimensions of the platinum silicide layer, regardless of the dimensions of the layer.

Finally, the inventor set out to achieve the aim of obtaining rapid synthesis, merely requiring moderate heat treatments.

DESCRIPTION OF THE INVENTION

These aims and others are achieved by means of the invention providing, firstly, a method for producing a graphene sheet on a platinum silicide, having the formula $Pt_xSi$, wherein x is a number greater than or equal to two, wherein the method is characterized in that it comprises:

a) producing a stack by:
  i) depositing a layer C1 of a diffusion barrier material on a substrate;
  ii) depositing, on the layer C1, a layer C2 of a carbon-containing material, wherein said carbon-containing material optionally comprises silicon;
  iii) depositing, on the layer C2, a layer C3 of platinum;
  iv) if the carbon-containing material of the layer C2 is free from silicon, depositing, on the layer C3, a layer C4 of a material having the formula $Si_aC_bH_c$ wherein a is a strictly positive number, whereas b and c, which are identical or different, are positive numbers or zero; and b) heat-treating the stack obtained following step a), and in that the ratio of the number of platinum atoms found in the layer C3, with respect to the number of silicon atoms found in the layer C2 or the layer C4 is greater than or equal to two.

In this way, according to the invention, the synthesis of the graphene sheet is based on catalytic growth of the graphene from a solid carbon-containing source, the inventor having observed that, contrary to all expectation and preconceived ideas, it is possible to grow graphene on a silicide of a metal wherein carbon is slightly or very slightly soluble, such as platinum.

Furthermore, the inventor observed that, by adjusting the conditions for implementing steps a) and b) mentioned above, it is possible to obtain a multilayer or monolayer graphene sheet, over:
  either a layer of platinum silicide;
  or a plurality of spaced blocks of platinum silicide;
in extremely short times, typically less than ten minutes, and using temperatures not exceeding 900° C.

In this way, according to the invention, the platinum silicide may be in the form of a layer or in the form of a plurality of spaced blocks.

As mentioned above, the method firstly comprises a step a) for preparing a stack successively comprising a substrate, a layer C1 of a diffusion barrier material, a layer C2 of a carbon-containing material suitable for comprising silicon, a layer C3 of platinum and, if the carbon-containing material of the layer C2 is free from silicon, a layer C4 of a material $Si_aC_bH_c$.

The substrate may be of different types but should have a melting point greater than the temperature at which the heat treatment in step b) is performed.

Typically, it consists of a silicon substrate, in view of the high melting point of silicon (1414° C. at atmospheric pressure), the availability and low cost of this type of substrate. However, it may also consist of a germanium or quartz substrate.

The function of the layer C1 of diffusion barrier material is that of preventing the carbon found in the layer C2 from diffusing toward the substrate and, conversely, preventing the constituent material of the substrate from diffusing to the layer C2.

The diffusion barrier material may particularly be chosen from oxides such as silicon dioxide $SiO_2$, or from nitrides such as tantalum nitride TaN and titanium nitride TiN.

Advantageously, the diffusion barrier material is silicon dioxide as this substance makes it possible to obtain surfaces free from any roughness. The silicon dioxide is deposited in the form of a layer, preferentially by means of chemical vapor deposition (CVD), as this technique is particularly suitable for controlling the quality of the layer C1 obtained.

The function of the layer C2 of carbon-containing material is that of providing the carbon species which are the basis for the growth of the graphene sheet.

According to the invention, the carbon-containing material should be suitable for decomposition at the temperature chosen for the heat treatment in step b), i.e. at a temperature generally between 200° C. and 900° C., so as to release the carbon contained therein.

In this way, the carbon-containing material may particularly be chosen from amorphous carbon-containing materials which are free from silicon and, in particular, from amorphous carbon, hydrogenated amorphous carbon a-C:H, amorphous exclusively hydrocarbonated polymers such as saturated hydrocarbons (paraffin), polyolefins, particularly chosen from polyethylenes, polypropylenes, polybutylenes, polybutadienes, polystyrenes, synthetic polyisoprenes, natural rubber, isoprene-iso-butylene copolymers (also referred to as butyl rubbers), ethylene-butylene-diene (or EPDM) copolymers, styrene-isoprene-styrene (or SIS) sequenced copolymers, styrene-ethylene-butylene-styrene (or SEBS) sequenced copolymers, and mixtures thereof.

In an alternative embodiment, the carbon-containing material may also be chosen from amorphous carbon-containing materials comprising silicon, in which case it is preferable, for reasons explained hereinafter, for the material to have a proportion by mass of silicon greater than or equal to 20% of the total mass of the material. More advantageously, this proportion by mass is greater than or equal to 40% of the total mass of the material.

Typically, an amorphous carbon-containing material comprising silicon meeting these criteria is a hydrogenated amorphous silicon carbide having the formula $a-Si_\alpha C_\beta:H$, wherein α and β, which are identical or different, are strictly positive numbers.

Depending on the nature of the carbon-containing material, the material may be deposited in the form of a layer using techniques such as:
  chemical vapor deposition (or CVD), in all the forms thereof: atmospheric pressure CVD (or APCVD), low-pressure CVD (or LPCVD), ultra-high vacuum CVD (or UHVCVD), aerosol-assisted CVD (or AACVD), direct liquid injection CVD (or DLICVD), rapid thermal CVD (or RTCVD), initiated CVD (or i-CVD), atomic layer CVD (or ALCVD), hot wire CVD (or HWCVD), plasma-enhanced CVD (or PECVD), remote plasma-enhanced CVD (or RPECVD), microwave plasma CVD (or MWPCVD), etc.;
  physical vapor deposition (or PVD), in all the forms thereof: cathode sputtering PVD (e.g., magnetron, triode, high-power impulse magnetron), vacuum evaporation PVD, ion beam sputtering (or IBS) PVD, arc PVD, e.g. cathodic arc PVD, pulsed laser deposition (or PLD), etc.;

hybrid physical-chemical vapor deposition (or HPCVD);
sol-gel process deposition, more specifically by means of a liquid process, spin coating, roll coating or dip coating.

According to the invention, the layer C2 is, preferably, a layer of hydrogenated amorphous carbon or a hydrogenated amorphous silicon carbide having the formula a-$Si_\alpha C_\beta$:H wherein α and β are both equal to 1, preferentially deposited by means of plasma-enhanced chemical vapor deposition (or PECVD), wherein the pressure used is subatmospheric, while being greater than $10^{-6}$ Pa.

The function of the layer C3 of platinum is that of catalyzing the growth of the graphene sheet, via the formation of a layer of platinum silicide, described hereinafter.

So as to obtain a perfectly continuous layer C3, the layer is preferably deposited by means of any of the chemical or physical vapor deposition techniques mentioned above.

However, the preferred technique is physical vapor deposition (or PVD), since this technique is suitable for promoting the creation of columnar structures in the layer C3.

These structures, remaining in the platinum silicide layer after the formation thereof, enable the migration of carbon, which is released by the layer C2 during step b), to the surface of the platinum silicide, and, therefore, the formation of the graphene sheet.

Moreover, the deposition of the layer C3 is performed at a temperature ranging from 10° C. to 35° C., preferably from 20° C. to 30° C., and more preferentially, at a temperature of (25±1)° C.

The method according to the invention comprising the additional deposition, on the layer of platinum, of a layer C4 of a material having the formula $Si_a C_b H_c$ wherein the values a, b and c are as defined above, the additional deposition only being carried out if the carbon-containing material deposited in sub-step ii) is free from silicon.

Advantageously, the layer C4 in a layer of hydrogenated amorphous silicon a-Si:H, deposited by means of plasma-enhanced chemical vapor deposition (or PECVD), wherein the pressure used is subatmospheric, while being greater than $10^{-6}$ Pa.

Moreover, the method according to the invention comprises a step b) wherein the stack obtained following step a) undergoes a heat treatment.

The heat treatment is performed in a number of aims.

Firstly, the heat treatment enables the formation of a layer of platinum silicide, at the interface of the layer of platinum and the layer of material comprising silicon, regardless of whether the material was deposited in sub-step ii) or in sub-step iv) of the method according to the invention. This layer of platinum silicide may particularly be characterized by producing an X-ray diffraction image, from which those skilled in the art can readily deduce the stoichiometry with which platinum is found in $Pt_x Si$.

Secondly, the heat treatment enables the decomposition of the carbon-containing material into carbon species, the diffusion whereof through the layer of platinum silicide is facilitated by the existence, on a microscopic scale, of columnar structures which are retained after the formation of the layer of platinum silicide, as mentioned above.

Moreover, the heat treatment enables the catalytic reaction suitable for resulting in the formation of the graphene sheet. Indeed, after diffusion of the carbon species through the layer of platinum silicide, these species are located on the entire surface of the layer which is opposite that in contact with the layer C1. In this case, graphene nuclei are formed on the surface (nucleation phenomenon), and expand and eventually join and form, by coalescence, a continuous graphene sheet.

Finally, the heat treatment helps, in conjunction with the temperature at which the layer C3 is deposited, keep the layer of platinum silicide in the form of a layer or induce, by means of a dewetting phenomenon, the conversion of the layer of platinum silicide into a plurality of spaced blocks.

Various parameters have an effect on the diffusion of the carbon species through the layer of platinum silicide and, consequently, on the properties of the graphene sheet produced.

In this way, in order to produce a platinum silicide having the formula $Pt_x Si$, wherein x is a number greater than or equal to two, it will be important that those skilled in the art choose the appropriate thicknesses of the layers C2, C3 and optionally C4 deposited, or the proportion by mass of silicon in the layer C2 or the layer C4.

For example, if the amorphous carbon-containing material used in sub-step ii) comprises silicon, in a proportion greater than or equal to 20% of the total mass of the material, the inventor demonstrated, following the heat treatment, the majority formation of a layer of $Pt_x Si$, wherein x is a number greater than or equal to two. In this case, the inventor observed very rapid diffusion of the carbon species from the solid carbon-containing material through the layer of silicide.

In addition, the inventor noted an amplification of this diffusion rate for a proportion greater than or equal to 40% of the total mass of the material.

Moreover, the temperatures for the deposition of layers C2, C3 and, if applicable, C4 and the heat treatment are also important. In this way, as described hereinafter in the two embodiments of the method according to the invention, the heat treatment is carried out at sufficiently high temperature to enable the formation of a platinum silicide, the decomposition of the carbon-containing material of the layer C2, and, finally, the catalytic reaction giving rise to the formation of the graphene sheet, while being below the temperature at which at least one of the other constituents of the stack is liable to be degraded.

According to a first embodiment, the heat treatment is carried out at a temperature ranging from 700° C. to 900° C., preferably from 750° C. to 850° C., and more preferentially at a temperature of (800±5)° C.

Under these conditions, the heat treatment would appear to induce, firstly, the formation of a layer of platinum silicide. After diffusion of the carbon species from the carbon-containing material of the layer C2 through the layer of silicide, the graphene sheet is formed on the surface of the layer of silicide.

Following the formation of the graphene sheet, and at such temperatures, a dewetting phenomenon of the layer of platinum silicide would appear to take place.

This phenomenon, promoted by the low-temperature deposition of the layer of platinum, typically at a temperature ranging from 10° C. to 35° C. as explained above, consists of removing the layer platinum silicide situated below the graphene sheet, simultaneously at several points in the layer. This removal is carried out without any material loss.

Following the heat treatment, a graphene sheet provided, on one of the surfaces thereof, with a plurality of pins of platinum silicide at intervals is obtained.

In addition, the arrangement of the graphene sheet with respect to the underlying layers of the new stack obtained following step b), i.e. the layers of substrate, diffusion barrier material and platinum silicide, may be modified and adjusted according to the intended uses of the graphene sheet.

In this way, for example, the layer C1 of diffusion barrier material may be structured, after the deposition thereof, according to a predetermined pattern on all or part of the thickness thereof, whereby the dewetting of the layer of platinum silicide is performed according to the pattern. In this case, it is particularly possible, by adjusting the thickness of the layer C3 of platinum, to obtain, following the heat treatment, a graphene sheet locally in contact with the layer C1.

According to a second embodiment, the heat treatment comprises:
- a first heat treatment carried out at a temperature ranging from 250° C. to 350° C.; and followed by
- a second heat treatment carried out at a temperature ranging from 750° C. to 850° C.

The moderate temperature conditions involved in the first heat treatment give rise to the formation of a layer of platinum silicide, wherein the carbon species of the carbon-containing material do not undergo any degradation.

In this way, following this first heat treatment, a layer of platinum silicide $Pt_xSi$ is formed, covering the layer of carbon-containing material deposited in sub-step ii) of the method according to the invention.

The higher temperature conditions involved in the second heat treatment enable the diffusion of the carbon species from the carbon-containing material through the layer of platinum silicide, on the surface whereof the species take part in the formation of the graphene sheet, by means of the nucleation phenomenon mentioned above.

Moreover, regardless of the embodiment of the method according to the invention in question, the heat treatment is preferably carried out in a neutral atmosphere, i.e. neither oxidizing nor reducing, chosen for example from argon, helium, dinitrogen and mixtures thereof.

In this way, the method according to the invention enables, following steps a) and b), the formation of a graphene sheet on a platinum silicide, suitable for testing by Raman spectroscopy, particularly checking the appearance of the two characteristic peaks of graphene, the G peak at 1580 cm$^{-1}$ and the 2D peak at 2700 cm$^{-1}$. The ratio of the intensity of the 2D peak, referenced $I_{2D}$, with respect to that of the G peak, referenced $I_G$, is suitable for evaluating the number of layers of graphene comprised in the graphene sheet produced (see, for example, Reina et al., *Nano Lett.* 2009, 9(1), 30-35, [6]).

The invention also relates to a structure comprising, in the following order:
- a substrate;
- a layer C1 of a diffusion barrier material;
- a platinum silicide having the formula $Pt_xSi$, where x is a number greater than or equal to two, wherein the silicide is in the form of a layer or a plurality of spaced pins; and
- a graphene sheet.

In this structure, the preferred features of the substrate, the diffusion barrier material and the platinum silicide are as described above in relation to the method.

According to the invention, the graphene sheet may be a mono- or multilayer sheet, preference being given to a multilayer sheet, i.e. comprising at least two layers of graphene.

The structure according to the invention is suitable for use as is, i.e. without undergoing any additional processing, in a micro- or nanoelectronic device, for example as electrical contacts, memory points and resistive memories, or in a micro- or nanoelectromechanical device (MEMS or NEMS).

In an alternative embodiment, the structure according to the invention is also suitable for use in manufacturing a structure only formed from the graphene sheet and a platinum silicide, in the form of a layer or a plurality of spaced pins; in this case, the use includes the removal, for example by etching, of the substrate and the layer C1.

As explained in the description of the prior art above, a structure formed merely of a mono- or multilayer graphene sheet on a platinum silicide, having the formula $Pt_xSi$, where x is a number greater than or equal to two, has never been produced to date.

In this way, the invention also relates to a structure comprising a graphene sheet comprising at least one layer of graphene, wherein said sheet is provided, on one of the faces thereof, with a platinum silicide, having the formula $Pt_xSi$, where x is a number greater than or equal to two, and the silicide is in the form of a layer or a plurality of spaced pins.

The invention also relates to the use of a structure as defined above in manufacturing a micro- or nanoelectronic, or micro- or nanoelectromechanical, device.

Further features and advantages of the invention will emerge from the additional description hereinafter, relating to the examples of embodiments of the method according to the invention, with reference to the appended figures.

Obviously, these examples are merely given as illustrations of the subject matter of the invention and do not limit the subject matter in any way.

For the purposes of clarity, the dimensions of the various elements shown in FIGS. 1A to 1F, on one hand, and 2A to 2D, on the other hand, are not in proportion with the actual dimensions thereof.

DETAILED DESCRIPTION OF CERTAIN ILLUSTRATIVE EMBODIMENTS

Example 1

Synthesis of a Structure Comprising a Graphene Sheet on a Layer of Platinum Silicide Reference is made to FIGS. 1A to 1F illustrating, schematically, a first embodiment of the method according to the invention, for manufacturing a structure comprising a graphene sheet on a layer of platinum silicide.

Figure 1:
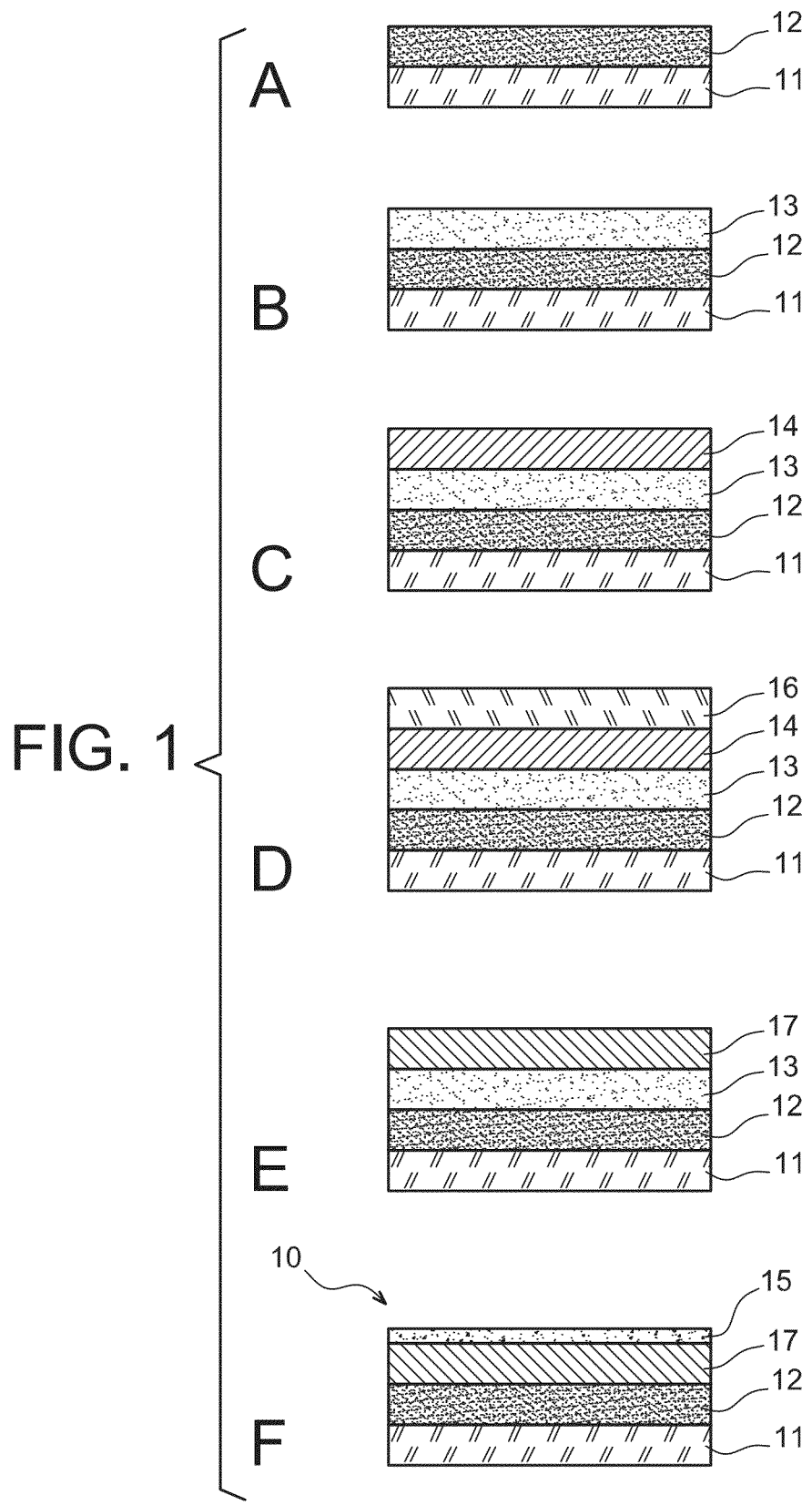
FIGS. 1A to 1F illustrate schematically a first embodiment of the method according to the invention.

This method comprises:
a) as seen in FIG. 1A, depositing, on a substrate 11, for example made of silicon, a layer 12 of a diffusion barrier material, for example a layer of silicon dioxide $SiO_2$; and b) as seen in FIG. 1B, depositing, on the layer 12 of diffusion barrier material, a layer 13 of a carbon-containing material, for example a layer of hydrogenated amorphous carbide a-C:H; and c) as seen in FIG. 1C, depositing, on the layer 13 of carbon-containing material, a layer 14 of platinum; and d) as seen in FIG. 1D, depositing, on the layer 14 of platinum, a layer 16 of a material comprising silicon, for example a layer of hydrogenated amorphous silicon a-Si:H; and e) heat-treating the stack formed following steps a) to d), wherein the heat treatment is carried out in two steps.

This gives rise to the stack illustrated in FIG. 1E which no longer comprises the layers 14 and 16 but, on the other hand, comprises a layer 17 of a platinum silicide $Pt_xSi$, and the structure 10 illustrated in FIG. 1F and which no longer comprises a layer 13 but, on the other hand, comprises a graphene sheet 15 over the entire surface of the layer 17 of $Pt_xSi$.

The steps of this first embodiment of the method according to the invention are described in detail hereinafter.

On a 200 mm diameter silicon sheet, an approximately 100 nm thick layer of $SiO_2$ is deposited by means of CVD, at a temperature of 1100° C. in an atmosphere consisting of 95% dinitrogen and 5% dioxygen.

On the layer of $SiO_2$ obtained, an approximately 40 nm thick layer of a-C:H is then deposited by PECVD, using propene and helium, for example in an Applied Materials Centura™ 5200 DxZ capacitive coupling reactor, and using the following operating parameters:
- radiofrequency excitation: 13.56 MHz;
- working pressure: 2 torrs (266 Pa);
- plasma supply power: 200 W;
- deposition temperature: 250° C.;
- propene stream: 410 cm$^3$/minute;
- helium stream: 700 cm$^3$/minute;
- deposition time: 27 seconds.

On this layer of a-C:H, an approximately 100 nm thick layer of platinum is then deposited by cathode sputtering PVD, using the following operating parameters:
- working pressure: 50 torrs (6.66 kPa);
- plasma supply power: 200 W;
- deposition temperature: 25° C.;
- argon stream: 500 cm$^3$/minute;
- deposition time: 1 minute.

Finally, on the layer of platinum obtained, an approximately 44 nm layer of a-Si:H is then deposited by PECVD, using silane, dihydrogen and helium, for example in an identical reactor to that used for the deposition of the layer of a-C:H, and using the following operating parameters:
- radiofrequency excitation: 13.56 MHz;
- working pressure: 4 torrs (533 Pa);
- plasma supply power: 500 W;
- deposition temperature: 350° C.;
- silane stream: 490 cm$^3$/minute;
- dihydrogen stream: 100 cm$^3$/minute;
- helium stream: 500 cm$^3$/minute;
- deposition time: 13 seconds.

Once the deposition has been completed, the whole is placed for 30 minutes in a chamber heated to 300° C. in an argon stream at 1000 cm$^3$/minute.

This gives rise to a stack as illustrated schematically in FIG. 1E comprising, on a silicon sheet 11, a layer 12 of $SiO_2$, a layer 13 of a-C:H and a layer 17 of platinum silicide $Pt_xSi$.

This layer of platinum silicide was characterized. Indeed, X-ray diffraction imaging displayed the stoichiometry of the silicide forming the layer 17. It consists of tri-platinum silicide $Pt_3Si$.

The stack is then placed for 15 minutes in a chamber heated at 800° C., for example a tower furnace, in an argon stream at 1000 cm$^3$/minute.

This gives rise to a structure as illustrated schematically in FIG. 1F and comprising, on a silicon sheet 11, a layer 12 of $SiO_2$, a layer 17 of $Pt_3Si$ and a graphene sheet 15 over the entire surface of the layer of platinum.

This graphene sheet is one nanometer thick and comprises three layers of graphene.

Example 2

Synthesis of a Structure Comprising a Graphene Sheet on a Plurality of Pins of a Platinum Silicide Reference is made to FIGS. 2A to 2D illustrating, schematically, a second embodiment of the method according to the invention, for manufacturing a structure comprising a graphene sheet on a plurality of pins of platinum silicide.

Figure 2:
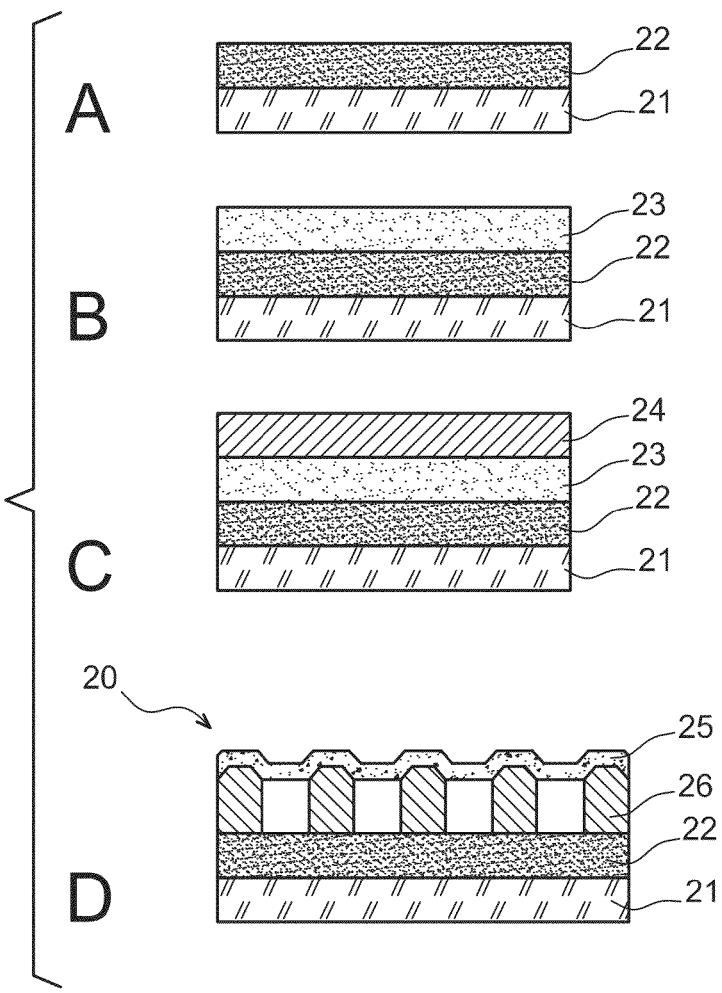
FIGS. 2A to 2D illustrate schematically a second embodiment of the method according to the invention.

This method comprises:

a) as seen in FIG. 2A, depositing, on a substrate 21, for example made of silicon, a layer 22 of a diffusion barrier material, for example a layer of silicon dioxide $SiO_2$; and b) as seen in FIG. 2B, depositing, on the layer 22 of diffusion barrier material, a layer 23 of a carbon-containing material comprising silicone, for example a layer of hydrogenated amorphous silicon carbide a-SiC:H; and c) as seen in FIG. 2C, depositing, on the layer 23 of carbon-containing material, a layer 24 of platinum; and d) heat-treating the stack formed following steps a) to c), in order to obtain the structure 20 illustrated in FIG. 2D which no longer comprises the layer 23, on the other hand, comprises a graphene sheet 25 on a plurality of pins 26 of a platinum silicide $Pt_xSi$, wherein the pins are spaced with respect to each other.

The steps of this second embodiment of the method according to the invention are described in detail hereinafter.

A layer of $SiO_2$ is deposited on a 200 mm diameter silicon plate, under the same operating conditions as those described in Example 1 above.

On the layer of $SiO_2$ obtained, an approximately 40 nm thick layer of a-SiC:H is then deposited by PECVD, using trimethylsilane, propene and helium, for example in the same type of reactor to that used in Example 1, and using the following operating parameters:
- radiofrequency excitation: 13.56 MHz;
- working pressure: 8.7 torrs (1.16 kPa);
- plasma supply power: 550 W;
- deposition temperature: 250° C.;
- trimethylsilane stream: 150 cm$^3$/minute;
- propene stream: 410 cm$^3$/minute;
- helium stream: 700 cm$^3$/minute;
- deposition time: 7 seconds.

After this, on the layer of a-SiC:H, an approximately 100 nm thick layer of platinum is then deposited by cathode sputtering PVD, using the following operating parameters:
- working pressure: 50 torrs (6.66 kPa);
- plasma supply power: 200 W;
- deposition temperature: 25° C.;
- argon stream: 500 cm$^3$/minute;
- deposition time: 1 minute.

Once the deposition has been completed, the whole is placed for 15 minutes in a chamber heated to 800° C. in an argon stream at 1000 cm$^3$/minute.

The pins of platinum silicide were characterized. Indeed, X-ray diffraction imaging displayed the stoichiometry with which the platinum is found in the platinum silicide forming the plurality of pins 26. It consists of tri-platinum silicide $Pt_3Si$.

This gives rise to a structure as illustrated schematically in FIG. 2D and comprising, on a silicon sheet 21, a layer 22 of $SiO_2$, a plurality of pins 26 of $Pt_3Si$ and a graphene sheet 25 provided, on one of the faces, thereof, with a plurality of pins 26 of $Pt_3Si$, wherein the pins are spaced with respect to each other.

This graphene sheet is one nanometer thick and comprises three layers of graphene.

Figure 3:
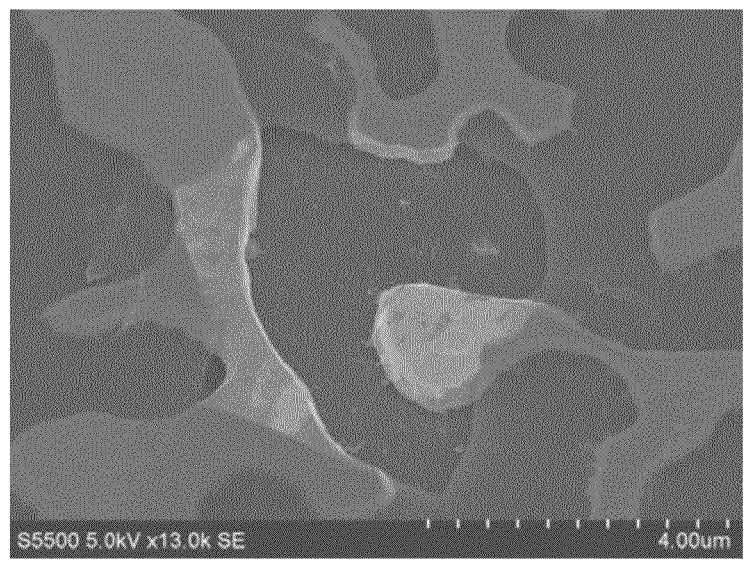
FIG. 3 is an image obtained by means of scanning electron microscopy (13,000 magnification factor) partially showing a structure obtained by means of the second embodiment of the method according to the invention.

An image of the surface of such a structure, in FIG. 3, was produced by means of scanning electron microscopy. This image makes it possible to observe, via an opening in the graphene sheet, the geometry and the random, or disordered, distribution of the pins 26 of $Pt_3Si$ arranged on the layer 22 of $SiO_2$.

The invention is not restricted to the embodiments of the method according to the invention described above and illustrated in the examples.

In this way, for example, it is possible to perform the following steps, on stacks such as those described in FIGS. 1E and 2C:

α) depositing a layer C1' of a diffusion barrier material;

β) depositing a layer C2' of a carbon-containing material on the layer C1', wherein said carbon-containing material optionally comprises silicon;

γ) depositing a layer C3' of platinum on the layer C2'; and

δ) optionally, depositing a layer C4' of a material $Si_aC_bH_c$ on the layer C3', if the carbon-containing material used in step β) is free from silicon, specifying that all the steps α), β), γ) and δ) can be repeated one or more times;

and heat-treating the new stack formed, in one or two steps, as described above.

This gives rise to a structure comprising a plurality of graphene sheets, wherein each of the sheets is situated on a layer of platinum silicide or on a plurality of spaced pins of platinum silicide.

CITED REFERENCES

[1] Reina et al., *Nano Res* 2009, 2, 509-516
[2] Li et al., *Science* 2009, 47, 2026-2031
[3] Sutter et al., *Phys. Rev. B* 2009, 80, 245411
[4] Hofrichter et al., *Nano Lett.* 2010, 10(1), 36-42
[5] Juang et al., Carbon 2009, 47, 2026-2031
[6] Reina et al., Nano Lett. 2009, 9(1), 30-35

What is claimed is:

1. A method for producing a structure comprising:
    a substrate;
    a layer C1 of a diffusion barrier material covering the substrate;
    a platinum silicide covering the layer C1, the platinum silicide being of formula PtxSi where x is a number greater than or equal to two, and being in a form of a layer or spaced pins; and
    a graphene sheet covering the layer or spaced pins of the platinum silicide;
    the method comprising:
    a) producing a stack by:
        i) depositing the layer C1 on the substrate;
        ii) depositing, on the layer C1, a layer C2 of a carbon-containing material free from silicon;
        iii) depositing, on the layer C2, a layer C3 of platinum;
        iv) depositing, on the layer C3, a layer C4 of a material of formula $Si_aC_bH_c$ wherein a is greater than 0 whereas b and c, which are identical or different, are greater than or equal to 0, a ratio of a number of platinum atoms found in the layer C3 with respect to a number of silicon atoms found in the layer C4 being greater than or equal to two; and
    b) heat-treating the stack obtained at a) so as to obtain the structure.

2. The method of claim 1, wherein the diffusion barrier material is silicon dioxide.

3. The method of claim 1, wherein the carbon-containing material free from silicon is selected from the group consisting of amorphous carbon-containing materials free from silicon.

4. The method of claim 3, wherein the amorphous carbon-containing material free from silicon is hydrogenated amorphous carbon a-C:H.

5. The method of claim 1, wherein the material having the formula $Si_aC_bH_c$ is hydrogenated amorphous silicon a-Si:H.

6. The method of claim 1, wherein the layer C2 is deposited by plasma-enhanced chemical vapor deposition.

7. The method of claim 1, wherein the layer C3 is deposited by physical vapor deposition, at a temperature ranging from 20° C. to 30° C.

8. The method of claim 5, wherein the layer of a-Si:H is deposited by plasma-enhanced chemical vapor deposition.

9. The method of claim 1, wherein the heat treatment is carried out at a temperature ranging from 750° C. to 850° C., in a neutral atmosphere.

10. The method of claim 1, wherein the heat treatment comprises:
    a first heat treatment carried out at a temperature ranging from 250° C. to 350° C., in a neutral atmosphere; and
    a second heat treatment carried out at a temperature ranging from 750° C. to 850° C., in a neutral atmosphere.

11. A method for manufacturing a device selected from the group consisting of microelectronic, nanoelectronic, microelectromechanical and nanoelectromechanical devices, comprising the implementation of the method of claim 1 during production of the device.

* * * * *